United States Patent
Yamamoto et al.

(10) Patent No.: US 6,251,507 B1
(45) Date of Patent: Jun. 26, 2001

(54) FLEXIBLE AROMATIC POLYMIDE FILM/ METAL FILM COMPOSITE SHEET

(75) Inventors: Tomohiko Yamamoto; Toshinori Hosoma; Kazuhiko Yoshioka, all of Ube (JP)

(73) Assignee: Ube Industries, Ltd., Yamaguchi (JP)

( * ) Notice: Subject to any disclaimer, the term of this patent is extended or adjusted under 35 U.S.C. 154(b) by 0 days.

(21) Appl. No.: 09/408,260

(22) Filed: Sep. 29, 1999

(30) Foreign Application Priority Data

Sep. 29, 1998 (JP) .................................................. 10275375

(51) Int. Cl.⁷ ............................... B32B 7/02; B32B 15/08
(52) U.S. Cl. ........................ 428/215; 428/213; 428/214; 428/216; 428/458; 428/473.5
(58) Field of Search .................................... 428/213, 214, 428/215, 216, 458, 473.5

(56) References Cited

U.S. PATENT DOCUMENTS 5,741,598 * 4/1998 Shiotani et al. ..................... 428/458

* cited by examiner

*Primary Examiner*—D. S. Nakarani
(74) *Attorney, Agent, or Firm*—Reed Smith LLP

(57) ABSTRACT

A flexible aromatic polyimide film/metal film composite sheet is composed of a multi-layered polyimide film having a highly heat-resistant aromatic polyimide layer to one surface of which is bonded another aromatic polyimide layer (in which the multi-layer polyimide film is prepared by simultaneous casting), and a metal film which is bonded to the latter polyimide layer by heating under pressure and subsequent cooling under pressure using a double belt press.

10 Claims, No Drawings

FLEXIBLE AROMATIC POLYMIDE FILM/METAL FILM COMPOSITE SHEET

FIELD OF THE INVENTION

The present invention relates a flexible aromatic polyimide film/metal film comsosite sheet.

BACKGROUND OF THE INVENTION

Aromatic polyimide films show a high temperature resistance, a good chemical properties, a high electrical insulating property, and a high mechanical strength, and are widely employed in various technical fields. For instance, an aromatic polyiraide film is favorably employed in the form of a continuous aromatic polyimide film/metal film composite sheet for manufacturing a flexible printed circuit board (FPC), a carrier tape for tape-automated-bonding (TAB), and a tape of lead-on-chip (LOC) structure.

The aromatic polyimide film/metal film composite sheet can be produced by bonding a polyimide film and a metal film using a conventional adhesive such as an epoxy resin. However, due to low heat-resistance of the conventional adhesive, the produced composite sheet cannot show a satisfactory heat-resistance.

For obviating the above-mentioned problem, a variety of bonding methods have been proposed. For instance, an aromatic polyimide film/metal film composite sheet is manufactured by forming a copper metal film on an aromatic polyimide film by electroplating. An aromatic polyimide solution (i.e, a solution of a precursor of the aromatic polyimide resin) is coated on a copper film, dried, and heated for producing a polyimide layer on the copper film.

An aromatic polyimide film/metal film composite sheet can be produced using a thermoplastic polyimide resin.

U.S. Pat. No. 4,543,295 describes a polyimide laminate which is produced by applying a pressure onto a composite sheet of an aromatic polyimide film, a polyimide adhesive, and a metal film in vacuo.

It is a problem in the known aromatic polyimide film/metal film composite sheet that a continuous composite sheet is hardly manufactured.

Japanese Patent Provisional Publications No. H4-33847 and No. H4-33848 disclose an aromatic polyimide film/metal film composite sheet manufactured by means of a roll press, which may produce a continuous composite sheet.

According to studies of the present inventors, the roll press is hardly employable for producing a continuous composite sheet having a large width. Moreover, creases or rumples are sometimes observed on the produced composite sheet.

SUMMARY OF THE INVENTION

It is an object of the invention to provide an aromatic polyimide film/metal film composite sheet in which the aromatic polyimide film and the metal film are bonded to each other at a high bonding strength and which has good appearance.

It is another object of the invention to provide a continuous aromatic polyimide film/metal film composite sheet having a large width (such as 400 mm or more), namely in the form of a continuous web, in which the aromatic polyimide film and the metal film are bonded to each other at a high bonding strength and which has good appearance.

It is a further object of the invention to provide an aromatic polyimide film/metal film composite sheet which is favorably employed for manufacturing FPC, TAB tape, or LOC tape.

The present invention resides in a flexible aromatic polyimide film/metal film composite sheet comprising a multi-layered polyimide film comprising a highly heat-resistant aromatic polyimide layer to one surface of which is bonded another aromatic polyimide layer, said multi-layer polyimide film being prepared by simultaneous casting, and a metal film which is bonded to the latter polyimide layer by heating under pressure and subsequent cooling under pressure using a double belt press.

A representative double belt press is described in U.S. Pat. No. 4,599,128, and is commercially available from Held Corporation (Germany).

The aromatic polyimide film/metal film composite sheet of the invention preferably is in the form of a continuous web which preferably has a width of 400 mm or more.

The multi-layered polyimide film of the aromatic polyimide film/metal film composite sheet may further comprise an aromatic polyimide layer which is bonded to another surface of the highly heat-resistant aromatic polyimide layer. To this polyimide layer can be bonded another metal film by heating under pressure using a double belt press.

The simultaneous casting is preferably performed by simultaneously casting a solution containing a precursor of the highly heat-resistant aromatic polyimide in a solvent and a solution containing another aromatic polyimide or its precursor in a solvent on a temporary support.

In the aromatic polyimide film/metal film composite sheet, the highly heat-resistant aromatic polyimide layer preferably has a thickness of 5 to 125 $\mu$m and another aromatic polyimide layer (which is easily bonded to the metal film by applying heat under pressure) preferably has a thickness of 2 to 30 $\mu$m. The metal film preferably is an electrolytic copper film, a rolled copper film, an aluminum film, or a stainless film which preferably has a thickness of 5 to 50 $\mu$m.

The composite sheet of the invention, which has a 90° peel strength of 0.7 kg/cm or more. The peeling may be observed at an interface between the metal film and the polyimide layer.

DETAILED DESCRIPTION OF THE INVENTION

In the invention, the highly heat-resistant aromatic polyimide layer preferably comprises an aromatic polyimide which is preferably prepared by a reaction between 3,3',4,4'-biphenyltetracarboxylic dianhydride (herein referred to as s-BPDA) and p-phenylenediamine (herein referred to as PPD). If desired, 4,4'-diaminodiphenyl ether (herein referred to as DADE) and/or pyromellitic dianhydride (herein referred to as PMDA) may be employed in combination with s-BPDA and PPD, in molar ratios of 100/0 to 85/15 for PPD/DADE and 100/0 to 50/50 for s-BPDA/PMDA. Alternatively, the aromatic polyimide can be prepared by a reaction between PMDA and a combination of PPD and DADE, in which DADE/PPD is 90/10 to 10/90 in terms of molar ratio. Alternatively, the aromatic polyimide can be prepared by a reaction between a combination of 3,3',4,4'-benzophenonetetracarboxylic dianhydride (herein referred to as BTDA) and PMDA and a combination of PPD and DADE, in which BTDA/PMDA is 20/80 to 90/10 in terms of molar ratio and PPD/DADE is 30/70 to 90/10 in terms of molar ratio.

The highly heat-resistant aromatic polyimide layer preferably has no glass transition temperature at temperatures lower than 350° C., and preferably has a linear expansion coefficient (for both MD and TD directions measured at 50 to 200° C.) in the range of $5\times10^{-6}$ to $20\times10^{-6}$ cm/cm/° C.

The highly heat-resistant aromatic polyimide can be prepared by random polymerization or block polymerization. Otherwise, previously prepared two or more kinds of polyamide acid solutions are mixed and then subjected to copolymerization to give a highly heat-resistant aromatic polyimide.

The reaction is generally performed in an organic solvent, using the diamine compound(s) and tetracarboxylic dianhydride(s) in equimolar amounts to give a polyamide acid solution, in which a partially imidized polyamide acid may be present. In performing the reaction for preparing a polyamide acid, other aromatic tetracarboxylic diarhydrides and/or other aromatic diatnines such as 4,4'-diaminodiphenylmethane way be employed in combination, provided that the employment of such additional compounds does not essentially vary the desired property of the highly heat-resistant aromatic polyimide. Moreover, the aforementioned aromatic tetracarboxylic dianhydride and aromatic diamine way have on their aromatic rings one or more substituents such as a fluorine atom, hydroxyl, methyl or methoxy.

The aromatic polyimide layer which is thermoplastic and is bonded to the highly heat-resistant aromatic polyimide layer and to which a metal film is bonded preferably comprises an aromatic polyimide which is prepared from a combination of 1,3-bis(4-aminophenoxy)benzene (herein referred to as TPER) and 2,3,3',4'-biphenyltetracarboxylic dianhydride (herein referred to as a-BPDA), a combination of 1,3-bis(4-aminophenoxy)-2,2-dimethylpropane (herein referred to as DANPG) and 4,4'-oxydiphthalic dianhydride (herein referred to as ODPA), a combination of 4,4'-oxydiphthalic dianhydride, pyromellitic dianhydride, and 1,3-bis(4-aminophenoxy)benzene, a combination of 1,3-bis(3-aminophenoxy)benzene and 3,3',4,4'-benzophenonetetracarboxylic dianhydride, or a combination of 3,3'-diaminobenzophenone, 1,3-bis(3-aminophenoxy)benzene, and 3,3',4'4'-benzophenonetetracarboxylic dianhydride.

The thermoplastic polyimide layer can be prepared from a dope solution containing an aromatic polyamide acid in an organic solvent, which is produced from the above-mentioned tetracarboxylic dianhydride and diamine compound by a reaction in an organic solvent at 100° C. or a lower temperature, particularly at a temperature of 20 to 60° C.

Alternatively, the thermoplastic polyimide layer can be formed using a solution of a thermoplastic polyimide which is produced by heating the polyamide acid at a temperature of 150 to 250° C., or heating the polyamide acid at a temperature of not higher than 150° C., particularly 15 to 50° C., in the presence of a imidizing agent, to give the desired polyimide in the solution; removing the solvent by evaporation or precipitating the polyimide in a bad solvent, to give a polyimide powder, and then dissolving the polyimide powder in an appropriate solvent.

In the preparation of the polyamide acid for the thermoplastic polyimide layer, relatively small amounts of other aromatic tetracarboxylic dianhydrides and/or diamine compounds way he employed in combination in addition to these aromatic tetracarboxylic dianhydrides and diamine compounds, provided that no essential change is brought about in the obtainable thermoplastic polyimide. Examples of the optionally employable aromatic tetra-carboxylic dianhydrides include 3,3',4,4'-biphenyltetracarboxylic dianhydride, 2,2-bis(3,4-dicarboxyphenyl)propane dianhydride, and 2,3,6,7-naphthalenetetracarboxylic dianhydride.

Examples of the optionally employable diamine compounds include flexible aromatic diamines containing plural benzene rings, such as 4,4'-diaminodiphenyl ether, 4,4'-diaminobenzophenone, 4,4'-diaminodiphenylmethane, 2,2-bis(4-aminophenyl)propane, 1,4-bis(4-aminophenoxy)benzene, 4,4'-bis(4-aminophenyl)diphenyl ether, 4,4'bis(4-aminophenyl)diphenylmethane, 4,4'-bis(4-aminophenoxy)diphenyl ether, 4,4'-bis(4-aminophenoxy)diphenylmethane, 2,2-bis [4-(aminophenoxy)phenyl]propane, and 2,2-bis[4-(4-aminophenoxy)phenyl]hexafluoropropane; aliphatic amines, such as 1,4-diaminobutane, 1,6-diaminohexane, 1,8-diaminooctane, 1,4-diaminodecane, and 1,12-diaminododecane; and diaminosiloxanes, such as bis(3-aminopropyl)tetramethyldisiloxane. The optionally employable aromatic diamine compound can be employed in an amount of 50 molar % or less, particularly 20 mol. % or less, per the total amount of the diamine compounds. The optionally employable aliphatic diamine or diaminosiloxane can be employed in an aunt of 10 molar % or less, per the total amount of the diamine compounds. If the optionally employable diamine compound is incorporated in an amount exceeding the above-rmentioned upper limit, the heat-resistance of the resulting polyimide is unsatisfactory low.

In the preparation of the thermoplastic aromatic polyimide, a dicarboxylic anhydride such as phthalic anhydride or its derivative, hexahydrophthalic anhydride or its derivative, or succinic anhydride or its derivative can be incorporated so as to cap the amine terminal of the resulting aromatic polyimide.

In the preparation of the polyamide acid for the production of the thermoplastic polyimide layer, the diamine compound and the carboxylic anhydride compound (which includes a tetracarboxylic dianhydride and a dicarboxylic anhydride) are used in a molar ratio of 0.92:1 to 1.1:1, particularly 0.98:1 to 11:1, more particularly 0.99:1 to 1.1:1 in terms of the molar amount of the amino group and the molar amount of the carboxylic anhydride (i,e., the molar amount of the tetracarboxylic dianhydride, and the molar amount of the dicarboxylic anhydride, if it is used in combination). The dicarboxylic anhydride is preferably employed in a molar amount of 0.05 or less, particularly 0.02 or less, based of one molar amount of the tetracarboxylic dianhydride. If the diamine compound and the carboxylic anhydride are used in a molar ratio outside of the above-mentioned range, the resulting thermoplastic aromatic polyimide becomes to have a relatively small molecular weight so that the thermoplastic aromatic polyimide layer shows a low bonding strength to a metal film.

Further, a gelation-inhibiting agent such as a phosphate-type stabilizer (e.g., triphenyl phosphite, or triphenyl phosphate) may be employed in the process of polymerization of the polyamide acid in an amount of 0.01 to 1%, based on the amount of the polyamide acid. Furthermore, an imidizing agent such as a basic organic catalyst (e.g, imidazole, 2-imidazole, 1,2-dimethylimidazole, or 2-phenylimidazole) may be added to the dope solution (i.e., polyamide acid solution) in an amount of 0.05 to 10 wt. %, based on the amount of the polyamide acid. The imidizing agent is effective to well imidize the polyamide acid at a relatively low temperature.

In addition, a metal compound such as an organic aluminum compound (e.g., aluminum triacetylacetonate), an inorganic aluminum compound (e.g., aluminum hydroxide), or an organic tin compound may be incorporated into the dope solution in an amount of 1 ppm or more (in terms of the amount of metal), particularly 1 to 1,000 ppm, based on the amount of the polyamide acid, so that the thermoplastic polyimide layer can be bonded to a metal film at a higher bonding strength.

The preparation of the polyamide acid (for the preparation of the high heat-resistant aromatic polyimide layer as well as for the preparation of the thermoplastic aromatic polyimide layer) can be performed in an organic solvent such as N-methyl-2-pyrollidone, N,N-dimethylformamide, N,N-dimethylacetamide, N,N-diethylacetamide, dimethylsulfoxide, hexamethylphosphorarnide, N-methylcaprolactam, or cresol or its derivative. The organic solvent can be employed in combination.

The multi-layered polyimide film employed for the production of the aromatic polyimide film/metal film composite sheet can be preferably produced by simultaneously casting a solution containing a precursor of the highly heat-resistant aromatic polyimide in a solvent and a solution containing another aromatic polyimide (for preparing the thermoplastic polyimide layer) or its precursor in a solvent on a temporary support. If desired, an additional solution containing an aromatic polyimide for the thermoplastic polyimide layer is also simultaneously casted so as to give a three-layered polyimide film having a structure of a thermoplastic polyimide layer/highly heat-resistant polyimide layer/thermoplastic, polyimide layer. Examples of the terprary supports include a stainless mirror surface and a stainless belt. The casted solutions are then heated on the temporary support to a temperature of 100 to 200° C., so as to give a self-supporting semi-cured film or a self-supporting film containing a small amount of a solvent. A higher heating treatment may lower the desired bonding strength between the highly heat-resistant layer and the thermoplastic layer.

The simultaneous casting of a solution containing a precursor of the highly heat-resistant aromatic polyimide in a solvent and a solution containing another aromatic polyimide (for preparing the thermoplastic polyimide layer) or its precursor in a solvent on a terporary support is described, for instance, in Japanese Patent Provisional Publication No. H3-180343. The simultaneous casting can be carried out using an extruding die.

The two- or three-layered film of polyamide acid and/or polyimide acid produced by the simultaneous casting is dried by heating and then further heated to a temperature between the glass transition temperature (Tg) and the decomposition temperature of the polyimide for the thermoplastic polyimide layer, preferably at a temperature of 250 to 400° C. (surface temperature measured by a surface thermometer), preferably for a period of 1 to 60 minutes. Thus produced two- or three-layered aromatic polyimide film comprises a highly heat-resistant polyimide layer(i.e., substrate layer)/thermoplastic polyimide layer, or a thermoplastic polyimide layer/highly heat-resistant polyimide layer (i.e., substrate layer)/thermoplastic polyimide layer.

The thermoplastic polyimide preferably has a glass transition temperature (Tg) of 180 to 275° C., particularly 200 to 275° C. The thermoplastic polyimide preferably does not become to a liquid at temperatures of from its Tg to 300° C., and preferably shows a modulus of elasticity of 0.0002 to 0.2 time at 270° C., based on a modulus of elasticity measured at 50° C.

The substrate layer (i.e., a highly heat-resistant polyimide film layer) preferably has a thickness of 5 to 125 $\mu$m, while the thermoplastic polyimide layer preferably has a thickness of 2 to 30 $\mu$m. In the multi-layered aromatic polyimide film, the substrate layer preferably has a thickness of 7.5 to 98.5%, particularly 15 to 90%, based on the total thickness of the multi-layered film.

The simultaneous casting is favorably employed because it gives the multi-layered film with less thermal deterioration.

The multi-layered aromatic polyimide film preferably has a dimensional variation of less than ±0.10% at room temperature and a dimensional variation of less than ±0.10% at 150° C.

Examples of the metal films employed for the preparation of the composite sheet of the invention include copper film, aluminum film, iron film, gold film, or a film of metal alloy. Preferred are an electrolytic copper film and a rolled copper film. The metal film preferably has a small surface roughness, such as Rz of 7 $\mu$m or less and Ra of 5 $\mu$m or less, particularly 0.5 to 5 $\mu$m. A metal film having a small surface roughness is available under the name of VLP or LP (or HME) for a copper film. There is no limitation with respect to the thickness of the metal film, but a thickness in the range of 5 to 50 $\mu$m, particularly 5 to 35 $\mu$m, is preferred.

In the invention, the multi-layered aromatic polyimide film produced in the above-mentioned procedures and a metal film are laminated one on another and then heated under pressure and cooled under pressure using a double belt press to manufacture the desired flexible aromatic polyimide film/metal film composite sheet. The double belt press using a heating liquid medium and a liquid hydraulic press is preferably employed.

In the manufacturing procedure of the flexible composite sheet of the invention, the laminate of a multi-layered polyimide film and the metal film is heated under pressure in a heating zone of a double belt press to a temperature between the temperature higher than Tg of the thermoplastic polyimide layer by 20° C. and 400° C., particularly between the temperature higher than Tg of the thermoplastic polyimide layer by 30° C. and 400° C., and subsequently is cooled (preferably to a temperature lower than Tg of the thermoplastic polyimide layer by 20° C., particularly by 30° C., or lower) still under pressure in the double belt press. It is preferred to pre-heat both of the multi-layered polyimide film and the metal film before they are introduced into a double belt press. The drawing rate of the manufactured flexible composite sheet from the double belt press can be 1 m/min. or more.

The use of the double belt press is particularly advantageous in the case of manufacturing a continuous flexible aromatic polyimide film/metal film composite sheet (i.e., polyimide film/metal film web) having a width of approximately 400 mm or more, particularly approximately 500 mm or more. The resulting flexible polyimide film/metal film web generally has a 90° peel strength of 0.7 kg/cm or more, particularly 1 kg/cm or more, and has a good appearance having almost no creases or rumples on the surface of the bonded metal film.

The flexible composite web of the invention preferably has a low dimensional variation in any areas. For instance, a mean dimensional variation of L, C and R (i.e., light end, center, and right end of the composite sheet web) is ±0.10% or less at room temperature (dried after etching) and at 150° C. (heat treatment after etching) The flexible composite web processed in the double belt press is then wound in the form of a roll and stored in the form of a roll.

The flexible composite web of the invention stored in the form of a roll can be extended, etched and cut to give, for example, a substrate for electronic device. Accordingly, the flexible composite aromatic polyimide film/metal film composite sheet can be in the form of a small piece.

The invention is further described by the following examples, in which "part(s)" means "part(s) by weight".

In the following examples, the physical characteristics and bonding strength of the flexible composite sheet were determined by the methods described below:

Dimensional variation: determined by a method defined in JIS-C-6471 for measurement of copper film-laminated board for flexible printed circuit board;

Thermal expansion coefficient: 50 to 200° C., measured at 5°/min. (mean value in TD and MD directions), cm/cm/° C.;

Glass transition temperature (Tg): determined from a measured viscoelasticity;

Bonding strength: given in terms of 90° peel strength;

Resistance to soldering: the first observation is done on a surface after dipping in a solder bath at 300° C. for one minute, and the second observation is done after heating to 280° C. for 10 minutes after hygroscopic treatment;

Appearance: the surface of metal filmn is observed with respect to creases or rumnples, and marked in the following manner, AA for good, BB for unsatisfactry, CC for bad.

[Preparation of Dope-1 for Preparing Highly Heat-resistant Aromatic Polyimide Layer]

In a reaction vessel equipped with a stirrer and a nitrogen gas-inlet was placed N-methyl-2-pyrollidone. Into the vessel were then placed p-phenylenediamine (PPD) and 3,3',4,4'-biphenyltetracarboxylic dianhydride (s-BPDA) in a molar ratio of 1000:998, so as to prepare a solution containing the monomrs at 18 wt. % concentration. After the addition was complete, the mixture was kept at 50° C. for 3 hours, for performing the reaction. The obtained reaction mixture was a polyamide acid solution in the form of a brown viscous liquid showing a viscosity of approximately 1,500 poise (at 25° C.).

The resulting solution was employed as Dope-1.

[Preparation of Dope-2 for Preparing Thermoplastic Aromatic Polyimide Layer]

In a reaction vessel equipped with a stirrer and a nitrogen gas-inlet was placed N-methyl-2-pyrollidone. Into the vessel were then placed 1,3-bis(4-aminophenoxy)benzene (TPE-R) and 2,3,3',4'-biphenyltetracarboxylic dianhydride (a-BPDA) in a molar ratio of 1000:1000, so as to prepare a solution containing the monomers at 22 wt. % concentration. Further, triphenyl phosphate was added in an amount of 0.1 wt. %, based on the amount of the monomers. After the addition was complete, the mixture was kept at 25° C. for 1 hour, for performing the reaction The obtained reaction mixture was a polyamide acid solution in the form of a brown viscous liquid showing a viscosity of approximately 2,000 poise (at 25° C.).

The resulting solution was employed as Dope-2.

[Productions of Multi-layered Polyimide Films-1, -2, -3]

Dope-2, Dope-1 and Dope-2 were extruded from an extruding dye having three slits (multi-manifold die) to simultaneously coat Dope-2, Dope-1 and Dope-2 one on another on a metallic support. Thus coated layers were continuously heated using an air heated to 140° C. Thus solidified films was separated from the support, and placed in a heating furnace. In the furnace, the solidified films were heated gradually by increasing the temperature from 200° C. to 320° C. for removing the solvent and performing imidation, so that a continuous three-layered aromatic polyimide film was produced and wound aroun a winding roll.

In the above-mentioned maner, the below-mentioned three continuous multi-layered aromatic polyimide films (thermoplastic polyimide layer/highiy heat-resistant polyimide layer/thermoplastic polyimide layer) having different thickness were produced:

Multi-layered polyimide film-1
  Thickness: 5 μm/15 μm/5 μm
  Tg of thermoplastic polyimide: 250° C.
  Modulus of elasticity of thermoplastic polyimide at 270° C.: approximately 0.002 time of that at 50° C.
Multi-layered polyimide film-2
  Thickness: 8 μm/34 μm/8 μm
  Tg of thermoplastic polyimide: same
  Modulus of elasticity: same
Multi-layered polyimide film-3
  Thickness: 5 μm/8 μm/5 μm
  Tg of thermoplastic polyimide: same
  Modulus of elasticity: same Comparison Example 1

The multi-layered polyimide film-1 and two electrolytic copper films (in the form of a roll, CF-T9, Ra: 2 μm, thickness: 18 μm, available from Fukuda Metal Foil-Powder Industries Co., Ltd.) were laminated and pressed continuously under heating using a combination of a press roll (heated to 380° C.) and an elastic roll (heated to 200° C.), to manufacture a flexible composite sheet (width: approximately 320 mm), which was then wound around a winding roll. All procedures were performed under atmospheric conditions and the heated composite sheet was cooled by placing it at an ambient temperature.

The evaluation on the obtained flexible composite sheet was given below:
  appearance: BB for both metal surfaces
  90° peel strength: 1.0 kg/cm for A-side surface and 1.1 kg/cm for B-side surface)
  Resistance to soldering: AA (300° C.×60 sec.) for both surfaces, CC (280° C.×10 sec., after hygroscopic treatment)

EXAMPLE 1

The multi-layered polyimide film-1 which was preheated to approximately 150° C. and two electrolytic copper films of 18 μm thick (CF-T9, described above) were laminated and introduced into a double belt press. In the heating zone of the double belt press, the laminate was heated up to 381° C. (highest temperature) under pressure, and then cooled in the cooling zone down to 117° C. (lowest temperature) under pressure, to manufacture a flexible composite sheet (width: approximately 530 mm), which was then wound aroun a winding roll.

The evaluation on the obtained flexible composite sheet was given below:
  appearance: AA for both metal surfaces
  dimensional variation (at room temperature):
    L/MD: +0.008%, TD: +0.04%
    C/MD: −0.009%, TD: +0.04%
    R/MD: +0.02%, TD: +0.02%
  dimensional variation (at 150° C.):
    L/MD: −0.03%, TD: +0.01%
    C/MD: −0.05%, TD: +0.003%
    R/MD: +0.002%, TD:−0.02%
  90° peel strength:
    A-side surface/L: 1.5 kg/cm, C: 1.4 kg/cm, R: 1.5 kg/cm
    B-side surface/L: 1.7 kg/cm, C: 1.8 kg/cm, R: 1.9 kg/cm
  Resistance to soldering: AA (300° C.×60 sec.) for both surfaces, AA (280° C.×10 sec., after hygroscopic treatment)

EXAMPLE 2

The multi-layered polyimide film-1 which was preheated to approximately 150° C. and two electrolytic copper films of 12 μm thick (CF-T9, described above) were laminated and introduced into a double belt press. In the heating zone of the double belt press, the laminate was heated up to 381° C. (highest temperature) under pressure, and then cooled in the cooling zone down to 212° C. (lowest temperature) under pressure, to manufacture a flexible composite sheet (width: approximately 530 mm), which was then wound around a winding roll.

The evaluation on the obtained flexible composite sheet was given below:

appearance: AA for both metal surfaces dimensional variation (at room temperature):
  L/MD: −0.002%, TD: +0.07%
  C/MD: −0.03%, TD: +0.01%
  R/MD: −0.002%, TD: +0.01% dimensional variation (at 150° C.):
  L/MD: −0.06%, TD: +0.02%
  C/MD: −0.08%, TD: −0.03%
  R/MD: −0.02%, TD: −0.04%

90° peel strength:
  A-side surface/L: 1.1 kg/cm C: 1.1 kg/cm, R: 1.1 kg/cm
  B-side surface/L: 13 kg/cm C: 1.3 kg/cm, R: 1.4 kg/cm Resistance to soldering: AA (300° C.×60 sec.) for both surfaces, AA (280° C.×10 sec., after hygroscopic treatment)

EXAMPLE 3

The multi-layered polyimide film-1 which was preheated to approximately 150° C. and two rolled copper films of 18 μm thick (BHY13HT, available from Japan Energy Co., Ltd.) were laminated and introduced into a double belt press. In the heating zone of the double belt press, the laminate was heated up to 381° C. (highest temperature) under pressure, and then cooled in the cooling zone down to 212° C. (lowest temperature) under pressure, to manufacture a flexible composite sheet (width: approximately 530 mm), which was then wound around a winding roll.

The evaluation on the obtained flexible composite sheet was given below:

appearance: AA for both metal surfaces dimensional variation (at room temiperature):
  L/MD: −0.04%, TD: −0.03%
  C/MD: −0.03%, TD: +0.02%
  R/MD: −0.03%, TD: +0.03% dimensional variation (at 150° C.):
  L/MD: −0.09%, TD: −0.08%
  C/MD: −0.08%, TD: −0.01%
  R/MD: −0.08%, TD: +0.001%

90° peel strength:
  A-side surface/L: 1.0 kg/cm, C: 1.1 kg/cm, R: 1.0 kg/cm
  B-side surface/L: 1.2 kg/cm, C: 1.5 kg/cm, R: 1.2 kg/cm Resistance to soldering: AA (300° C.×60 sec.) for both surfaces, AA (280° C.×10 sec., after hygroscopic treatment)

Comparison Example 2

The procedures of Example 1 were repeated except for replacing the multi-layered polyimide film-1 with a composite polyirnide sheet which was previously prepared by coating a varnish of the polyamide acid for thermoplastic polyimide on both surfaces of a commercially available aromatic polyimide film of 25 μm thick (Upilex 25S, product of Ube Industries, Ltd.) and then heated for imidation to form a thermoplastic polyimide layer of 18 μm thick, give a flexible composite sheet.

The evaluation on the obtained flexible composite sheet was given below:

appearance: CC for both metal surfaces

90° peel strength: 0.3 kg/cm for A-side surface and 0.2 kg/cm for B-side surface)

Resistance to soldering: CC (300° C.×60 sec.) for both surfaces, CC (280° C.×10 sec., after hygroscopic treatment)

EXAMPLES 4 and 5

The procedures of Example 1 were repeated except for replacing the multi-layered polyimide film-2 with the multi-layered polyimide film-2 (for Example 4) or the multi-layered polyimide film-3 (for Example 5), to give a flexible composite sheet.

The evaluation on the obtained flexible composite sheet was satisfactory as in Example 1.

What is claimed is:

1. A continuous flexible aromatic polyimide film/metal film composite sheet having a width of 400 mm or more and comprising a multi-layered polyimide film comprising a layer of heat-resistant aromatic polyimide having a glass transition temperature of at least 350° C. to one surface of which is bonded a thermplastic aromatic polyimide layer having a glass transition temperature of 180 to 275° C., said multi-layer polyimide film bing prepared by simultaneous casting, and a metal film which is bonded to the latter polymide layer by heating under pressure and subsequent cooling under pressure using a double belt press.

2. The composite sheet of claim 1, wherein the multi-layered polyimide film further comprises another thermoplastic aromatic polyimide layer having a glass transition temperature of 180 to 275° C. which is bonded to another surface of the heat-resistant aromatic polyimide layer.

3. The composite sheet of claim 2, wherein another metal film is bonded to the thermoplastic aromatic polyimide layer by heating under pressure using a double belt press.

4. The composite sheet of claim 1, wherein the simultaneous casting is performed by simultaneously casting a solution containing a precursor of the heat-resistant aromatic polyimide in a solvent and a solution containing the thermoplasic aromatic polyimide or its precursor in a solvent on a temporary support.

5. The composite sheet of claim 1, wherein the heat-resistant aromatic polyimide layer has a thickness of 5 to 125 μm and the thermoplastic aromatic polyimide layer has a thickness of 2 to 30 μm.

6. The corrmposite sheet of claim 1, wherein the metal film is an electrolytic copper film, a rolled copper film, an aluminum film, or a stainless film.

7. The composite sheet of claim 1, wherein the metal film has a thickness of 5 to 50 μm.

8. The composite sheet of claim 1, which has a width of 500 mm or more.

9. The composite sheet of claim 1, which has a 90° peel strength of 0.7 kg/cm or more.

10. The composite sheet of claim 1, wherein the thermoplastic aromatic polyimide layer to which the metal film is bonded comprises an aromatic polyimide which is prepared from a combination of 1,3-bis(4-aminophenoxy)benzene and 2,3,3',4'-biphenyltetracarboxylic dianhydride, a combination of 1,3-bis(4-aminophenoxy)-2,2-dimethylpropane and 4,4'-oxydiphthalic dianhydride, a combination of 4,4'-oxydiphthalic dianhydride, pyrornellitic dianhydride, and 1,3-bis(4-aminophenoxy)benzene, a combination of 1,3-bis(3-aminophenoxy)benzene and 3,3'4,4'-benzophenonetetracarboxylic dianhydride, or a combination of 3,3'-diaminobenzophenone, 1,3-bis(3-aminophenoxy)benzene, and 3,3',4,4'-henzophenonetetracarboxylic dianhydride.

* * * * *